United States Patent
Morimoto et al.

(10) Patent No.: US 9,756,722 B2
(45) Date of Patent: *Sep. 5, 2017

(54) TRANSPARENT ELECTROCONDUCTIVE FILM

(71) Applicant: JNC CORPORATION, Tokyo (JP)

(72) Inventors: Yoshitaka Morimoto, Chiba (JP); Takuro Tanaka, Chiba (JP); Koji Ohguma, Chiba (JP); Aki Kuromatsu, Chiba (JP)

(73) Assignee: JNC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/370,762

(22) PCT Filed: Dec. 21, 2012

(86) PCT No.: PCT/JP2012/083365
§ 371 (c)(1),
(2) Date: Jul. 4, 2014

(87) PCT Pub. No.: WO2013/103104
PCT Pub. Date: Jul. 11, 2013

(65) Prior Publication Data
US 2015/0002760 A1    Jan. 1, 2015

(30) Foreign Application Priority Data

Jan. 6, 2012    (JP) .................. 2012-001120

(51) Int. Cl.
*C09K 19/00*    (2006.01)
*H05K 1/02*    (2006.01)
(Continued)

(52) U.S. Cl.
CPC ............ *H05K 1/0274* (2013.01); *C08J 7/045* (2013.01); *G02F 1/13338* (2013.01);
(Continued)

(58) Field of Classification Search
CPC .. H05K 1/0274; H05K 1/0313; H05K 3/0064; H05K 2201/0104;
(Continued)

(56) References Cited

U.S. PATENT DOCUMENTS

2002/0158853 A1* 10/2002 Sugawara et al. ............ 345/176
2010/0013784 A1*  1/2010 Nashiki et al. ............... 345/173
(Continued)

FOREIGN PATENT DOCUMENTS

CN    1320929    11/2001
CN    1653561    8/2005
(Continued)

OTHER PUBLICATIONS

"International Search Report (Form PCT/ISA/210)", mailed on Mar. 19, 2013, pp. 1-6.
(Continued)

*Primary Examiner* — Ruiyun Zhang
(74) *Attorney, Agent, or Firm* — Jianq Chyun IP Office

(57) ABSTRACT

The transparent electroconductive film is provided with: a transparent substrate formed from a film-shaped polymer resin; a first hard coat layer laminated on one surface of the substrate; and a first transparent conductor layer laminated on the upper side of the first hard coating layer. The substrate has a film thickness of 2 to 250 μm. The first hard coating layer is formed from a curable resin containing an inorganic oxide, and has a film thickness of 0.01 μm to less than 0.5 μm, or more than 6 μm to 10 μm. The first transparent conductor layer is formed from at least one material selected from the group consisting of an inorganic oxide, a metal, and carbon, has a film thickness of 10 nm to 2 μm, and is patterned so as to have formed thereon a patterned section and a non-patterned section.

9 Claims, 9 Drawing Sheets

(51) Int. Cl.
*G06F 3/041* (2006.01)
*G06F 3/044* (2006.01)
*C08J 7/04* (2006.01)
*G02F 1/1333* (2006.01)
*H05K 1/03* (2006.01)

(52) U.S. Cl.
CPC .............. *G06F 3/041* (2013.01); *G06F 3/044* (2013.01); *H05K 1/0298* (2013.01); *H05K 1/0313* (2013.01); *C08J 2367/02* (2013.01); *C08J 2433/04* (2013.01); *G06F 2203/04103* (2013.01); *H05K 2201/0108* (2013.01); *H05K 2201/0323* (2013.01); *H05K 2201/0326* (2013.01); *Y10T 428/1055* (2015.01)

(58) Field of Classification Search
CPC .... H05K 2201/0323; H05K 2201/0326; G02F 1/13338; Y10T 428/1055; G06F 3/044; G06F 2203/04103; C08J 7/042; C08J 7/045; G09G 2330/04
USPC ............ 428/1.4; 349/1.2; 174/255; 345/173, 345/174; 156/60; 385/130, 131
See application file for complete search history.

(56) References Cited

U.S. PATENT DOCUMENTS

| | | | |
|---|---|---|---|
| 2011/0141059 A1* | 6/2011 | Nashiki ................... | G06F 3/044 345/174 |
| 2013/0113757 A1* | 5/2013 | Tanaka et al. ................. | 345/174 |

FOREIGN PATENT DOCUMENTS

| | | |
|---|---|---|
| CN | 101430440 | 5/2009 |
| CN | 102034565 | 4/2011 |
| CN | 102184754 | 9/2011 |
| CN | 102265354 | 11/2011 |
| JP | 2002-326301 | 11/2002 |
| JP | 2004-047456 | 2/2004 |
| JP | 2005-071901 | 3/2005 |
| JP | 2008-041669 | 2/2008 |
| JP | 2010-027294 | 2/2010 |
| JP | 2010-201779 | 9/2010 |
| JP | 2011076932 | 4/2011 |
| JP | 2012-103968 | 5/2012 |
| TW | 200404311 | 3/2004 |
| TW | 201009854 | 3/2010 |
| WO | 2012/005271 | 1/2012 |

OTHER PUBLICATIONS

"1st Office Action of China Counterpart Application", issued on Dec. 17, 2015, p. 1-p. 16, with English translation thereof.
"Office Action of Taiwan Counterpart Application" with English translation, issued on Mar. 10, 2016, p. 1-p. 17.
"Office Action of China Counterpart Application" with English translation, issued on Jul. 22, 2016, p. 1-p. 20.
"Office Action of Japan Counterpart Application" with partial English translation thereof, issued on Oct. 4, 2016, p. 1-p. 8.

* cited by examiner

FIG. 7

| Reference Example 1 |
|---|
| ITO |
| SiO$_2$ |
| A1 |
| PET |
| B1 |

| Reference Example 2 |
|---|
| ITO |
| SiO$_2$ |
| A2 |
| PET |
| B2 |

| Reference Example 3 |
|---|
| ITO |
| SiO$_2$ |
| A3 |
| PET |
| B3 |

| Reference Example 4 |
|---|
| ITO |
| SiO$_2$ |
| A4 |
| PET |
| B4 |

| Comparative Example 1 |
|---|
| ITO |
| SiO$_2$ |
| PET |
| B5 |

| Comparative Example 2 |
|---|
| ITO |
| SiO$_2$ |
| A6 |
| PET |
| B6 |

| Reference Example 5 |
|---|
| Ag |
| A4 |
| PET |
| B4 |

| Comparative Example 3 |
|---|
| Ag |
| A6 |
| PET |
| B6 |

| Reference Example 6 |
|---|
| C |
| A4 |
| PET |
| B4 |

| Comparative Example 4 |
|---|
| C |
| A6 |
| PET |
| B6 |

FIG. 8

Example 1

| ITO |
|---|
| SiO$_2$ |
| A7 |
| PET |
| B7 |

Example 2

| ITO |
|---|
| SiO$_2$ |
| A8 |
| PET |
| B8 |

Example 3

| ITO |
|---|
| SiO$_2$ |
| A9 |
| PET |
| B9 |

Example 4

| ITO |
|---|
| SiO$_2$ |
| A10 |
| PET |
| B10 |

Example 5

| ITO |
|---|
| SiO$_2$ |
| A11 |
| PET |
| B11 |

Comparative Example 5

| ITO |
|---|
| SiO$_2$ |
| PET |
| B12 |

Example 6

| Ag |
|---|
| A11 |
| PET |
| B11 |

Comparative Example 6

| Ag |
|---|
| PET |
| B12 |

Example 7

| C |
|---|
| A11 |
| PET |
| B11 |

Comparative Example 7

| C |
|---|
| PET |
| B12 |

Reference Example 1    Example 3

TRANSPARENT ELECTROCONDUCTIVE FILM

CROSS-REFERENCE TO RELATED APPLICATION

This application is a 371 application of an international PCT application serial no. PCT/JP2012/083365, filed on Dec. 21, 2012, which claims the priority benefit of Japan application no. 2012-001120, filed on Jan. 6, 2012. The entirety of each of the above-mentioned patent applications is hereby incorporated by reference herein and made a part of this specification.

TECHNICAL FIELD

The invention relates to a transparent electroconductive film, and, more particularly, to a multi-layer transparent electroconductive film including a substrate formed of a transparent plastic film, and a hard coat layer, a transparent dielectric layer, a transparent conductive layer and so on laminated on the substrate.

BACKGROUND ART

Transparent electroconductive films including a substrate of a transparent plastic film and a transparent electroconductive thin film laminated on the substrate are used in a variety of applications utilizing their electrical conductivity including flat panels such as liquid crystal displays, touch panels for smartphones, car navigation systems and digital cameras, and electromagnetic shielding films for shielding electromagnetic waves from display screens of liquid crystal displays and plasma displays or electromagnetic waves from cellular phones.

Touch panels are categorized, according to their position detection method, into several types including optical type, ultrasonic wave type, electromagnetic induction type, capacitance type and resistance film type. A resistance film type touch panel has a structure in which a transparent electroconductive film and a glass with a transparent conductive layer (indium tin oxide, which is hereinafter abbreviated as "ITO") laminated thereon are opposed to each other with dot spacers therebetween. When the transparent electroconductive film is pressed, the transparent conductive layer (ITO) on the opposing glass substrate and a transparent conductive layer (ITO) of the transparent electroconductive film are electrically connected at a point where there is no dot spacer so that the position of touch can be determined. Thus, the problem is that the touch panel reaches the end of its service life when the strength of the dot spacers or the ITO decreases. On the other hand, a capacitance type touch panel has a transparent conductive layer patterned on a substrate. When the touch panel is touched with a finger or the like, the capacitance of the finger is detected, causing a change in the resistance value between the touched point and the patterned transparent conductive layer. This allows accurate detection of two-dimensional positional information. Because of their structure, the capacitance type touch panels are characterized by having no movable parts, and have high reliability, a long service life, and excellent optical characteristics such as transparency.

As described above, in some touch panels, the transparent conductive layer of the transparent electroconductive film is provided with a predetermined pattern so that the input position can be detected. However, when patterned portions (portions having a transparent conductive layer) and non-patterned portions (pattern opening portions having no transparent conductive layer) having a clear difference in optical characteristics are formed by the patterning, the panels may have poor appearance as display elements. In particular, in the case of capacitance type touch panels, because the transparent conductive layer is formed on the front surface of the display, a transparent conductive layer having a good appearance even when patterned is required.

In addition, because the electromagnetic waves generated in liquid crystal displays may cause malfunction of touch panels, a transparent electroconductive film is inserted between the touch panel and the liquid crystal display of capacitance type touch panels to provide a function against electromagnetic interference (EMI). Such a transparent electroconductive film must have few or no other factors that may affect the appearance of the panels as display elements (such as the formation of interference fringes and a decrease in light transmittance).

For example, Patent Literature 1 discloses a transparent electroconductive laminate including a film substrate and an electroconductive thin film provided on the substrate. The transparent electroconductive laminate is superior not only in transparency and scratch resistance of the electroconductive thin film but also in flex resistance (refer to paragraph 0005 of Patent Literature 1).

PRIOR ART DOCUMENT

Patent Document

Patent Document 1 JP-A-2002-326301

SUMMARY OF THE INVENTION

Problem to be Solved by the Invention

As described above, there are various factors that cause a decrease in visibility of multi-layer transparent electroconductive films.

It is, therefore, an object of the invention to provide a multi-layer transparent electroconductive film having improved visibility.

Means for Solving the Problem

The inventors conducted intensive studies to solve the above problems. As a result, the inventors found that the formation of interference fringes on the transparent electroconductive film can be prevented when the transparent electroconductive film has a hard coat layer having a thickness in a certain range, and accomplished the invention.

A transparent electroconductive film according to the first aspect of the present invention comprises, as shown in FIGS. 1A and 1B, for example, a transparent substrate 11 formed of a film-like polymeric resin; a first hard coat layer 12 laminated on one side of the substrate 11; and a first transparent conductive layer 14 laminated on the upper side of the first hard coat layer 12. The substrate 11 has a thickness of 2 to 250 µm. The first hard coat layer 12 is formed of a curable resin containing an inorganic oxide and has a thickness of 0.01 µm or greater and less than 0.5 µm or greater than 6 µm and 10 µm or less. The first transparent conductive layer 14 is formed of at least one selected from the group consisting of inorganic oxides, metals and carbon, has a thickness of 10 nm to 2 µm, and has been patterned to form patterned portions and non-patterned portions.

The expression "on the upper side of the first hard coat layer" includes both the case where, when the substrate is placed with the first hard coat layer facing up, the layer is placed directly on the upper side of the first hard coat layer (refer to the first transparent conductive layer 14 in FIG. 1B, for example) and the case where the layer is placed indirectly on the upper side of the first hard coat layer (refer to the first transparent conductive layer 14 in FIG. 1A, for example).

With this configuration, the first hard coat layer, which has a thickness of 0.01 μm or greater and less than 0.5 μm or greater than 6 μm and 10 μm or less, can prevent the formation of interference fringes on the transparent electroconductive film. In addition, because the hard coat layer is formed of a curable resin, the hard coat layer can prevent low-molecule substances, such as oligomers, from being eluted out of the substrate formed of a polymeric resin by a heat treatment or the like during the production process, and limits the influence of the low-molecule substances on the layers laminated thereon.

As for the transparent electroconductive film according to the second aspect of the present invention, in the transparent electroconductive film according to the first aspect of the invention, the inorganic oxide contained in the first hard coat layer 12 is in the form of fine particles having a volume average particle size of 10 to 100 nm and is contained in the first hard coat layer 12 in an amount of 5 to 95% by weight.

With this configuration, when the thickness of the first hard coat layer is 0.01 μm or greater, there is no possibility that the dispersion stability of the inorganic oxide contained in the first hard coat layer is impaired and the inorganic oxide is aggregated or dispersed only in the surface regions of the first hard coat layer. Thus, the first hard coat layer can be prevented from having an uneven surface or from having a decrease in transparency.

The transparent electroconductive film according to the third aspect of the present invention, in the transparent electroconductive film according to the first or the second aspect of the invention, as shown in FIG. 1A, for example, further comprises a first transparent dielectric layer 13 laminated between the first hard coat layer 12 and the first transparent conductive layer 14. The first transparent dielectric layer 13 is formed of an inorganic substance and has a thickness of 10 to 100 nm.

With this configuration, when the first transparent conductive layer is patterned by etching using an acid solution, the first transparent dielectric layer can prevent the first hard coat layer from being deteriorated when formed of a material having high resistance to acids.

As for the transparent electroconductive film according to the fourth aspect of the present invention, in the transparent electroconductive film according to any one of the first aspect to the third aspect of the invention, the first hard coat layer 12 has a refractive index of 1.40 to 1.90, and when the first transparent dielectric layer 13 is provided, the first transparent dielectric layer 13 has a refractive index of 1.30 to 1.50.

With this configuration, the hard coat layer and the transparent dielectric layer, which is laminated as needed, have appropriate refractive index and thickness, and therefore can make the pattern shape formed in the transparent conductive layer less visible. This, combined with the prevention of the formation of interference fringes, allows a transparent electroconductive film having high visibility to be obtained. In addition, because the hard coat layer is formed of a curable resin containing an inorganic oxide, the refractive index of the hard coat layer can be easily adjusted by selecting the type and amount of the inorganic oxide contained therein.

As for the transparent electroconductive film according to the fifth aspect of the present invention, in the transparent electroconductive film according to any one of the first aspect to the fourth aspect of the invention, the substrate 11 is formed of at least one selected from the group consisting of polyethylene terephthalate, polyethylene naphthalate, triacetyl cellulose and polycarbonate. The curable resin used to form the first hard coat layer 12 is an ultraviolet curable resin. The first transparent conductive layer 14 is formed of at least one selected from the group consisting of indium tin oxide, indium zinc oxide, gallium-added zinc oxide, aluminum-added zinc oxide, silver, copper and carbon. And when the first transparent dielectric layer 13 is provided, the first transparent dielectric layer 13 is formed of silicon dioxide.

When the first transparent conductive layer is patterned by etching using an acid solution, the first transparent dielectric layer can prevent the first hard coat layer from being deteriorated when formed of silicon dioxide, which has especially high resistance to acids. In addition, when at least one metal oxide selected from the group consisting of indium tin oxide, indium zinc oxide, gallium-added zinc oxide and aluminum-added zinc oxide is used in the first transparent conductive layer, the first transparent dielectric layer can further improve the adhesion strength of the first transparent conductive layer. Further, when the first transparent dielectric layer is provided, the number of layers of the transparent electroconductive films increases, making it easier to adjust the refractive index of the entire transparent electroconductive film.

An image display device according to the sixth aspect of the present invention, as shown in FIG. 5, for example, comprises a touch panel 43 having the transparent electroconductive film according to any one of the first aspect to the fifth aspect of the present invention; and an image panel 41 provided on the substrate side of the transparent electroconductive film.

With this configuration, because the formation of interference fringes on the touch panel is prevented, an image display device having an image panel with improved display visibility can be obtained.

An image display device according to the seventh aspect of the present invention, as shown in FIG. 5, for example, comprises a touch panel that allows the user to input information by touching; an image panel 41 for displaying an image; and an electromagnetic shielding layer 42 having a transparent electroconductive film according to any one of the first aspect to the fifth aspect of the present invention. The electromagnetic shielding layer 42 is interposed between the touch panel and the image panel 41.

With this configuration, the electromagnetic shielding layer, which is prevented from forming interference fringes, can provide an electromagnetic interference (EMI) function, i.e., a function of preventing malfunction of the touch panel caused by electromagnetic waves generated in the image panel.

Effect of the Invention

The transparent electroconductive film of the invention can be prevented from forming interference fringes when the first hard coat layer is adjusted to an appropriate thickness.

Thus, a multi-layer transparent electroconductive film having high visibility can be obtained.

BRIEF DESCRIPTION OF DRAWINGS

FIG. 7 is a diagram, showing the layer configurations of Reference Examples 1 to 6 and Comparative Examples 1 to 4.

FIG. 8 is a diagram, showing the layer configurations of Examples 1 to 7 and Comparative Examples 5 to 7.

BEST MODE FOR CARRYING OUT THE INVENTION

The present application is based on Japanese Patent Application No. 2012-001120 applied on Jan. 6, 2012 in Japan. The content forms part thereof as the content of the present application. The invention will be more completely understood by the detailed description provided hereinafter. Further areas of applicability of the invention will become more apparent from the detailed description provided hereinafter. However, it should be understood that the detailed description and specific examples indicate desired embodiments of the invention, and are provided for the purpose of illustration only because it will be apparent to those skilled in the art that various modifications and variations can be made without departing from the spirit or scope of the invention from the detailed description. Applicants have no intention to present any described embodiments to the public, and among modifications and variations, the subject matter that may not be fallen within the scope of claims should also be part of the invention under the doctrine of equivalents.

Hereinafter, the embodiments of the invention will be explained with reference to drawings. In addition, an identical or similar symbol is attached to a mutually identical part or a corresponding part in each drawing, and an overlapped explanation is omitted. Moreover, the invention is in no way limited to embodiments as described below.

This invention is hereinafter described in detail.

[Transparent Electroconductive Film 10]

Figure 1A:
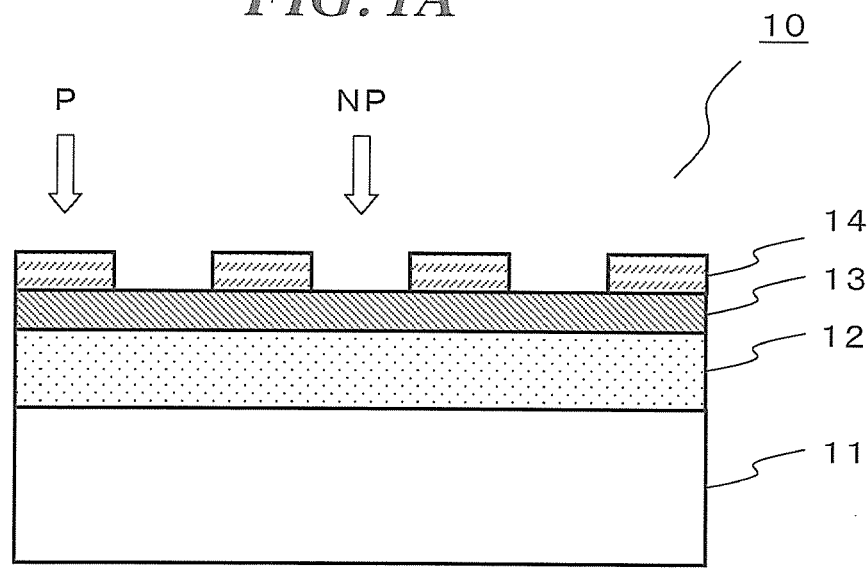
FIG. 1A is a cross-sectional view, illustrating the layer configuration of a transparent electroconductive film 10 having a transparent dielectric layer 13.

A transparent electroconductive film 10 according to a first embodiment of the invention is described with reference to FIG. 1A. It should be noted that FIG. 1 is intended to illustrate the layer configuration of the transparent electroconductive film 10 having a multi-layer structure and the thickness of each layer is exaggerated in FIG. 1. The transparent electroconductive film 10 includes a transparent plastic substrate 11 as a substrate, a hard coat layer 12, a transparent dielectric layer 13, and a transparent conductive layer 14. As shown in FIG. 1A, the hard coat layer 12 is laminated on one side of the transparent plastic substrate 11 (the upper side of the transparent plastic substrate 11 as seen in FIG. 1). When necessary, the transparent dielectric layer 13 is further laminated on the hard coat layer 12. The transparent conductive layer 14 is further laminated on the transparent dielectric layer 13. Thus, the transparent electroconductive film 10 has a multi-layer structure.

[Transparent Electroconductive Film 10']

Figure 1B:
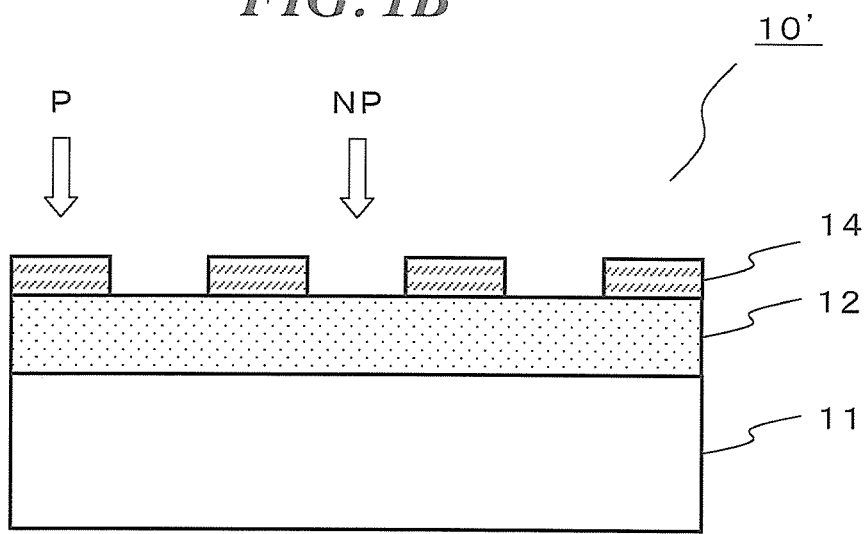
FIG. 1B is a cross-sectional view, illustrating the layer configuration of a transparent electroconductive film 10' without a transparent dielectric layer 13.

A transparent electroconductive film 10' is described with reference to FIG. 1B. The transparent electroconductive film 10' is a transparent electroconductive film constructed without providing the transparent dielectric layer 13.

[Transparent Plastic Substrate 11]

The transparent plastic substrate 11 is a transparent substrate 11 formed of a film-like polymeric resin. As the film-like polymeric resin for the transparent plastic substrate 11, various types of transparent plastic films may be used. Examples of the material of the transparent plastic film include resins such as polyester resin, acetate resin, polyether sulfone resin, polycarbonate resin, polyamide resin, polyimide resin, polyolefin resin, (meth)acrylic resin, polyvinyl chloride resin, polyvinylidene chloride resin, polystyrene resin, polyvinyl alcohol resin, polyarylate resin, polyphenylene sulfide resin and norbornene resin. Specific preferred examples include polyethylene terephthalate (PET), polyethylene naphthalate, triacetyl cellulose, polyether sulfone, polycarbonate, polyarylate and polyether ether ketone. Polyethylene terephthalate and polyethylene naphthalate are more preferred because they are superior in mechanical strength, dimensional stability, heat resistance, chemical resistance and optical characteristics, and can form a film excellent in surface smoothness and handling ability. Polycarbonate is more preferred because of its excellence in transparency, impact resistance, heat resistance, dimensional stability and flammability. When price and availability are also taken into account, polyethylene terephthalate is particularly preferred.

The transparent plastic substrate 11 has a thickness of 2 to 250 μm, preferably 10 to 200 μm, especially preferably 20 to 190 μm. When the thickness of the transparent plastic substrate 11 is 2 μm or greater, the transparent plastic substrate 11 can maintain mechanical strength thereof as a substrate and allows easy formation of the transparent conductive layer 14 of the transparent electroconductive film 10 and a pattern therein. When the thickness is 250 μm or less, the touch panel can be sufficiently thin to be suitable for use in mobile devices such as cellular phones and portable music terminals.

The transparent plastic substrate 11 has preferably been subjected to a surface activation treatment, such as an adhesion facilitating treatment (a treatment in which an adhesion facilitating agent is applied in-line to the transparent plastic substrate during the production thereof to improve the adhesivity of the transparent plastic substrate to the hard coat layer), a primer coating treatment (a treatment in which a primer coating agent is applied off-line to the transparent plastic substrate after the production thereof to improve adhesivity of the transparent plastic substrate to the hard coat layer), a corona discharge treatment, a flame treatment, an ultraviolet irradiation treatment, an electron beam irradiation treatment, an ozone treatment, a glow discharge treatment or a sputtering treatment. The surface activation treatment can improve the adhesion strength of the hard coat layer 12 to the transparent plastic substrate 11.

A hard coat layer 12 composed primarily of a curable resin is laminated on the transparent plastic substrate 11. The hard coat layer 12 provides the transparent plastic substrate 11 with a countermeasure against optical interference and curling, imparts chemical resistance to the transparent plastic substrate 11, and prevents low-molecule substances, such as oligomers, from bleeding out of the transparent plastic substrate 11.

[Hard Coat Layer 12]

The hard coat layer 12 is formed by applying a curable resin to the transparent plastic substrate 11 and curing the resulting coated film. A wet coating method, by which a resin dissolved in a solvent can be uniformly coated, is preferably used to apply the curable resin. Examples of wet coating methods that can be used include gravure coating and die coating. Gravure coating is a process in which a gravure roll having an engraved surface is immersed into a coating liquid and then the coating liquid on the engraved surface of the gravure roll is scraped off with a doctor blade so that a precise amount of coating liquid can remain in the recesses and be transferred onto a substrate. A liquid with a low viscosity can be coated into a thin layer by gravure coating. Die coating is a process in which coating is made by extruding a liquid from a coating head called die under pressure. Die coating can provide high-accuracy coating. In addition, the coating liquid is less likely to undergo a change in concentration and so on due to drying because the liquid is not exposed to the ambient air during application. Other examples of wet coating methods include spin coating, bar coating, reverse coating, roll coating, slit coating, dipping, spray coating, kiss coating, reverse kiss coating, airknife coating, curtain coating and rod coating, for example. The laminating method can be selected from these methods as appropriate based on the desired film thickness. In addition, when wet coating is used, a large scale-production can be done inexpensively with high production efficiency because coating liquid can be applied at a line speed of a few dozen meters per minute (such as approximately 20 m/min).

As used herein, the term "curable resin" means a resin which cures when exposed to heat or irradiation of ultraviolet rays or an electron beam and so on. Examples of the curable resin include silicone resin, acrylic resin, methacrylic resin, epoxy resin, melamine resin, polyester resin and urethane resin. Among these curable resins, ultraviolet curable resins are preferred from the standpoint of productivity. An ultraviolet curable resin is usually used with a photopolymerization initiator. Examples of the photopolymerization initiator include benzoin derivatives, benzophenone derivatives and phenylketone derivatives of various types, for example. The photopolymerization initiator is preferably added in an amount of 1 to 5 parts by weight based on 100 parts by weight of the ultraviolet curable resin. Because the curable resin is used as a coating liquid, it preferably remains in the form of a liquid until it is cured.

The concentration of the curable resin component in the coating liquid (hard coat layer coating liquid) can be selected as appropriate by adjusting the coating liquid to a viscosity suitable for the laminating method, such as a wet coating method. The concentration is preferably in the range of 5 to 80% by weight, more preferably in the range of 10 to 60% by weight. As the diluting solvent, methyl isobutyl ketone, for example, can be used. When necessary, heretofore known additives including, for example, a leveling agent, such as a surfactant, may be added to the coating liquid. The addition of a leveling agent enables the surface tension of the coating liquid to be controlled to prevent surface defects, such as crawling and craters, which may occur during the formation of the hard coat layer.

An inorganic oxide is added to the coating liquid for the hard coat layer to adjust the refractive index of the hard coat layer 12 after curing. Examples of the material of the inorganic oxide that can be contained in the hard coat layer include $SiO_2$, $Al_2O_3$, $SnO_2$, $ZrO_2$, $TiO_2$ and composite oxides thereof. A material obtained by mixing a plurality of inorganic oxides may be used. To prevent a decrease of the transparency of the hard coat layer 12, the inorganic oxide is preferably in the form of fine particles having a volume average particle size in the range of 1 to 100 nm, especially preferably in the range of 10 to 100 nm. The inorganic oxide is preferably added in an amount of 5 to 95% by weight of the resin solid content although it depends on the specific gravity thereof or the like. Because an inorganic oxide is added to the hard coat layer as described above, a hard coat layer having a desired refractive index can be easily obtained by adding an inorganic oxide having a high refractive index to increase the refractive index or increasing the amount of the inorganic oxide added. The inorganic oxide preferably has a particle size that is smaller than the thickness of the hard coat layer.

The hard coat layer 12 has a refractive index of 1.40 to 1.90, preferably 1.55 to 1.80. When the refractive index is 1.40 or higher, the difference in refractive index from the transparent dielectric layer 13 cannot be too small. In addition, the difference in optical characteristics between the patterned portions and the non-patterned portions cannot be large when the transparent conductive layer 14 is patterned and the patterned portions therefore tend to be less visible. On the other hand, when the refractive index is 1.90 or lower, a decrease of the visibility of the transparent electroconductive film 10 due to interference or other reasons can be prevented because the difference in refractive index from the transparent plastic substrate 11 cannot be too large even when PET, for example, is used for the transparent plastic substrate 11.

The hard coat layer 12 has a thickness of 0.01 to 10 μm. When the thickness of the hard coat layer 12 is adjusted within a specific range, the formation of interference fringes on the transparent electroconductive film can be prevented. The specific range is 0.01 to 0.5 μm, more preferably 0.15 to 0.35 μm, especially preferably 0.15 to 0.25 μm, when a thinner hard coat layer 12 is used, and 6 to 10 μm, more preferably 7 to 8 μm, when a thicker hard coat layer 12 is used. When the thickness is 10 μm or less, the hard coat layer 12 does not suffer from a decrease in transparency, such as total light transmittance, and can provide a weight reduction when used in a touch panel or the like.

Examples of the cure treatment that can be used to cure the curable resin include heating, ultraviolet irradiation, and electron beam irradiation. When the coated film contains a diluting solvent, the cure treatment is preferably performed after removing the diluting solvent remaining in the coated film by heating the coated film typically at a temperature in the range of 70 to 200° C. for a few dozens of minutes. When curing by heating is employed, the coated film is usually heated at a heating temperature of 80 to 250° C., preferably 100 to 200° C. At this time, the coated film may be heated for 30 to 90 minutes in an oven or for 5 to 30 minutes on a hot plate. When curing by ultraviolet irradiation is employed, the coating liquid may be irradiated with ultraviolet rays with a wavelength of 200 to 400 nm from a UV lamp (such as a high-pressure mercury lamp, ultrahigh-pressure mercury lamp, metal halide lamp or high-power metal halide lamp) for a short period of time (in the range of a few seconds to a few dozens of seconds). When curing by electron beam irradiation is employed, the coating liquid is irradiated with a low-energy electron beam from a self-shielded low-energy electron accelerator with energy of 300 keV or lower.

The hard coat layer 12 formed in this way has a function of reducing the difference in optical characteristics between the patterned portions and non-patterned portions of the transparent conductive layer 14. Thus, the transparent electroconductive film of this application, which has the hard coat layer 12, can have a simpler layer configuration as compared to conventional IM films.

[Transparent Dielectric Layer 13]

When the transparent dielectric layer 13 has a resistance against the acid solution that is used to form a pattern in the transparent conductive layer 14 by etching, it can prevent deterioration of the hard coat layer 12. Also, when the transparent conductive layer 14 is formed of a metal oxide, such as indium tin oxide, indium zinc oxide, gallium-added zinc oxide or aluminum-added zinc oxide, the adhesion strength of the transparent conductive layer 14 can be further improved by providing the transparent dielectric layer 13.

Examples of the material of the transparent dielectric layer 13 include inorganic substances such as NaF, $BaF_2$, LiF, $MgF_2$, $CaF_2$ and $SiO_2$. Among these, $SiO_2$ is preferred. Because $SiO_2$ has especially high resistance to acids, it can prevent deterioration of the hard coat layer 12 when the transparent conductive layer 14 is patterned by etching using an acid solution or the like.

Specific examples of the method for forming the transparent dielectric layer 13 include dry processes, such as sputtering, vacuum deposition and ion plating, and a wet method in which a silica sol, for example, is applied to form a transparent dielectric layer. A suitable method can be selected from the above methods as appropriate based on the required thickness. The use of a dry process is preferred because it is possible to form a film as thin as a few nm and because a homogeneous film with high smoothness can be formed. Especially, the selection of a high-purity sputtering target (film-forming material) is preferred because a film with less dust and particles can be formed. In addition, the use of a silica sol is preferred because a film can be formed easily.

The transparent dielectric layer 13 has a refractive index of 1.30 to 1.50, preferably 1.40 to 1.50. When the refractive index is 1.30 or higher, the film does not become porous. Thus, when the transparent conductive layer 14 is laminated thereon, the transparent conductive layer 14 becomes a uniform film and does not suffer from a decrease in electrical properties. On the other hand, when the refractive index is 1.50 or lower, the difference in refractive index from the transparent conductive layer 14 cannot be too small and patterned portions and non-patterned portions having similar optical characteristics can be easily formed when the transparent conductive layer 14 is patterned. The refractive index of the transparent dielectric layer 13 is preferably lower than that of the hard coat layer 12.

The transparent dielectric layer 13 has a thickness of 10 to 100 nm, preferably 15 to 80 nm, especially preferably 20 to 60 nm. When the thickness is 10 nm or greater, the transparent dielectric layer 13 does not become a discontinuous film and the stability of the film can be maintained. On the other hand, when the thickness is 100 nm or less, the transparent dielectric layer 13 is less likely to suffer from a decrease in transparency. The thickness of the transparent dielectric layer 13 is preferably equal to or smaller than that of the hard coat layer 12.

[Transparent Conductive Layer 14]

Examples of the material of the transparent conductive layer 14 include zinc oxide, tin oxide, aluminum oxide, titanium oxide, indium oxide, indium tin oxide (ITO), indium zinc oxide (IZO), gallium-added zinc oxide, fluorine-added tin oxide, antimony-added tin oxide, aluminum-added zinc oxide (AZO), silicon-added zinc oxide, silver, copper and carbon.

The transparent conductive layer 14 preferably has a thickness of 10 nm to 2 μm. The thickness of the transparent conductive layer 14 is preferably equal to or smaller than those of the hard coat layer 12 and the transparent dielectric layer 13.

The transparent conductive layer 14 preferably has a surface resistance value in the range of 1 to 1000Ω/□, more preferably in the range of 5 to 500Ω/□. In order to form the transparent conductive layer 14 as a continuous film having a surface resistance value in the above range, the thickness of the transparent conductive layer 14 is preferably 10 to 300 nm, more preferably 20 to 200 nm.

Specific examples of the method for forming the transparent conductive layer 14 include a wet method using a coating fluid composed primarily of an inorganic oxide and dry processes, such as sputtering, ion plating, electron-beam deposition and chemical vapor deposition (CVD). The use of a dry process is preferred because it is possible to form a film as thin as a few nm and because a homogeneous film with high smoothness can be formed. Especially, the selection of a high-purity sputtering target (film-forming material) is preferred because a film with less dust and particles can be formed. In particular, when an ITO is formed into a film by a dry process, the ratio between tin and indium in the resulting ITO film can be changed and, as a result, the refractive index (optical characteristics) and so on of the ITO can be changed easily by changing the ratio between the tin oxide and indium oxide in the target material. The use of a wet process is preferred because a film can be formed easily by, for example, a printing method in which a coating material containing ITO, IZO, silver, copper or carbon is applied and the resulting coated film is dried by heating and fusion-bonded.

After the transparent conductive layer 14 is formed, the transparent conductive layer 14 is patterned by etching. Various patterns may be formed based on the application in which the transparent electroconductive film 10 is used. The transparent conductive layer 14 is patterned by forming a masking having a desired pattern shape on a surface of the transparent conductive layer 14, removing the exposed parts of the transparent conductive layer 14 with an etchant or the like, and dissolving the masking with an alkaline fluid or the like. As the etchant, an acid is suitably used. Examples of the acid include inorganic acids such as hydrogen chloride, hydrogen bromide, nitric acid, sulfuric acid and phosphoric acid, organic acids such as acetic acid and oxalic acid, mixtures of these acids, and aqueous solutions of these acids and acid mixtures. However, the patterning method is not limited to the above method, and another method, such as laser ablation or screen printing, may be employed.

Figure 2A:
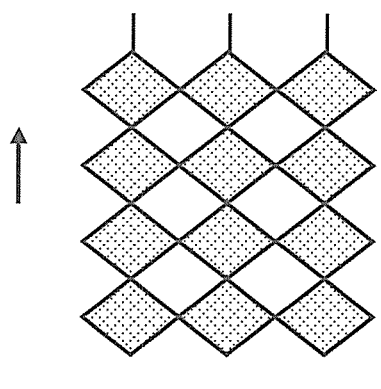
FIGS. 2A and 2B are diagrams, each illustrating an example of the pattern shape that may be formed in a transparent conductive layer.
Figure 2B:
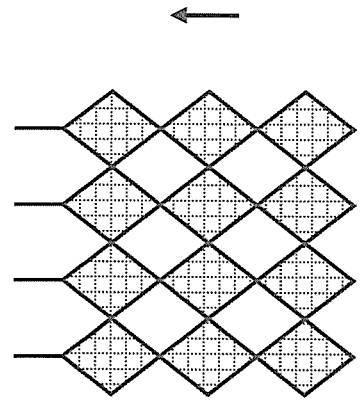

The pattern shape may be a diamond shape as shown in FIGS. 2A and 2B, for example. The shape is not limited thereto, and may be triangular or rectangular. The patterns shown in FIGS. 2A and 2B are each electrically connected in the direction of the arrow. Especially, the transparent conductive layer 14 is preferably formed in the form of a mesh or stripes because excellent electromagnetic shielding properties can be obtained without sacrificing the transparency. The transparent conductive layer preferably has a stripe width in the range of 1 to 40 μm, more preferably in the range of 5 to 30 μm. The intervals between the strips are preferably in the range of 50 μm to 500 μm, more preferably in the range of 100 μm to 400 μm.

When at least one metal oxide selected from the group consisting of indium tin oxide, indium zinc oxide, gallium-added zinc oxide and aluminum-added zinc oxide is used in the transparent conductive layer 14, the crystallinity can be improved by subjecting the transparent conductive layer 14 to an annealing treatment in a temperature range of 100 to 150° C. after the patterning in order to improve the electrical conductivity. The transparent conductive layer 14 has better electrical conductivity as its degree of crystallinity is higher. Thus, the transparent plastic substrate 11 can withstand a temperature of 150° C. or higher.

[Transparent Electroconductive Film 20]

Figure 3:
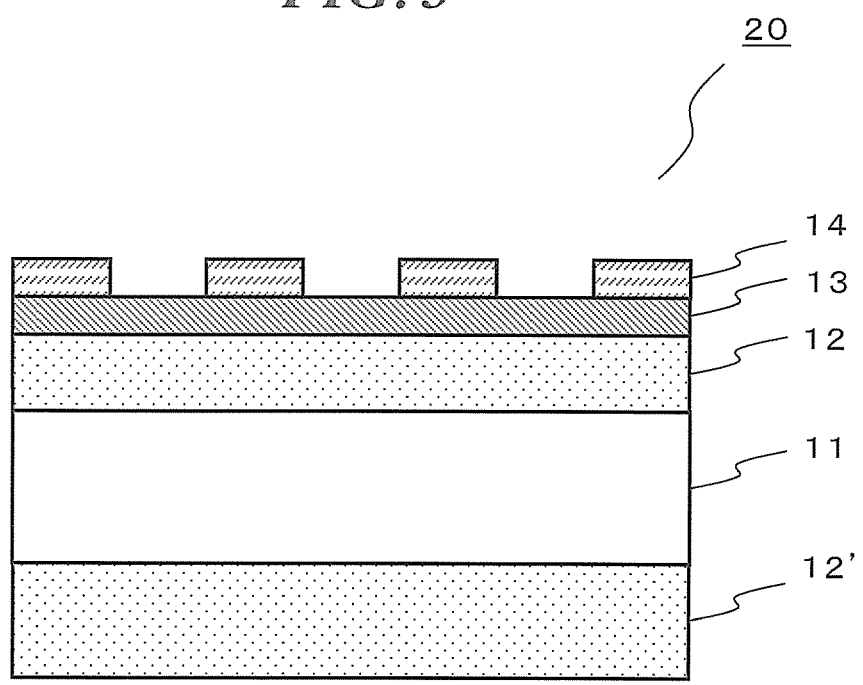
FIG. 3 is a cross-sectional view, illustrating the layer configuration of a multi-layer transparent electroconductive film 20 (having a transparent dielectric layer 13).

A transparent electroconductive film 20 according to a second embodiment of the invention is described with reference to FIG. 3. The transparent electroconductive film 20 further includes a hard coat layer 12' on the side of the transparent plastic substrate 11 shown in FIG. 1A opposite the hard coat layer 12. Thus, the transparent plastic substrate 11 is sandwiched between the hard coat layers 12 and 12' and is therefore prevented from being curled more reliably.

The material, thickness and refractive index of the hard coat layer 12' may be the same as or different from those of the hard coat layer 12, and the inorganic oxide contained in the hard coat layer 12' may be the same as or different from that contained in the hard coat layer 12. The hard coat layer 12' may not contain an inorganic oxide. For example, a layer formed of the same material as the hard coat layer 12 and containing the same inorganic oxide as the hard coat layer 12 but having a greater thickness than the hard coat layer 12 can be formed easily with high working efficiency.

[Transparent Electroconductive Film 30]

Figure 4:
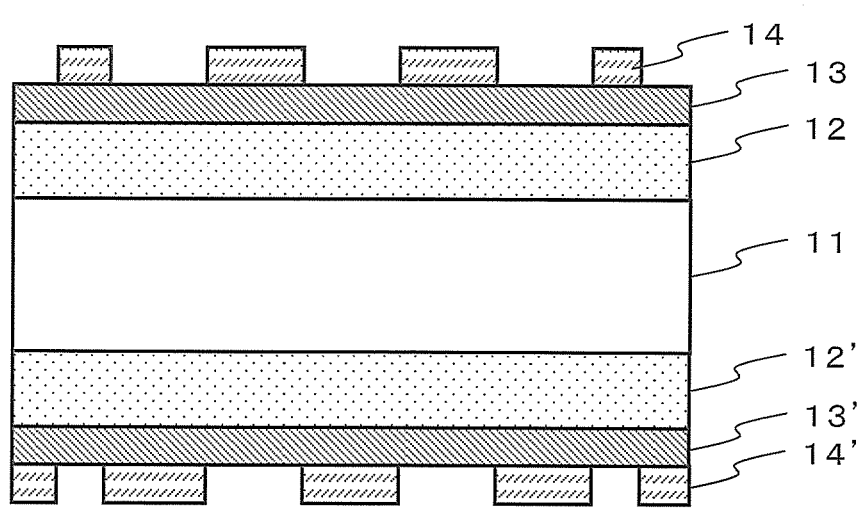
FIG. 4 is a cross-sectional view, illustrating the layer configuration of a multi-layer transparent electroconductive film 30 (having transparent dielectric layers 13, 13').

A transparent electroconductive film 30 according to a third embodiment of the invention is described with reference to FIG. 4. The transparent electroconductive film 30 further includes a hard coat layer 12', optionally a transparent dielectric layer 13', and a transparent conductive layer 14' on the side of the transparent plastic substrate 11 shown in FIG. 1 opposite the hard coat layer 12. As shown in FIG. 4, the hard coat layer 12' is laminated on the other side of the transparent plastic substrate 11 (the lower side of the transparent plastic substrate 11 as seen in FIG. 4). When necessary, the transparent dielectric layer 13' is further laminated on the underside of the hard coat layer 12'. The transparent conductive layer 14' is further laminated on the transparent dielectric layer 13'. In this way, layers are constructed in a symmetrical fashion on both sides of the transparent plastic substrate 11.

The transparent conductive layers 14 and 14' formed on both sides of the transparent plastic substrate 11 may have the same pattern but preferably have different patterns. For example, the pattern as shown in FIG. 2A is formed in the transparent conductive layer 14. The pattern as shown in FIG. 2B is formed in the transparent conductive layer 14' such that the pattern does not overlap the pattern of FIG. 2A. At this time, the patterns of FIGS. 2A and 2B are formed such that their electrical connection directions intersect each other (including perpendicular to each other). This combined use of the patterns of the transparent conductive layers 14 and 14' is preferred because it is suitable for use in projection capacitance type touch panels.

The transparent electroconductive film 30 may have both, one or neither of the transparent dielectric layer 13 and the transparent dielectric layer 13' as needed. The material, thickness and refractive index of the transparent dielectric layer 13' may be the same as or different from those of the transparent dielectric layer 13. In addition, the material, thickness and refractive index of the transparent conductive layer 14' may be the same as or different from those of the transparent conductive layer 14.

The layer configuration is not limited to those of the transparent electroconductive film 10, 20 and 30, and other configurations may be employed.

[Image Display Device 40]

Figure 5:
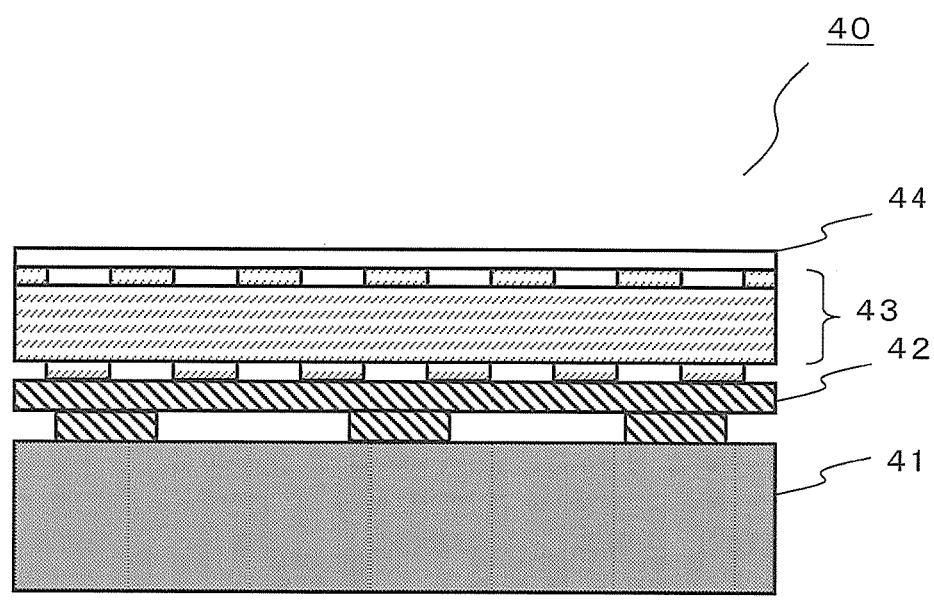
FIG. 5 is a cross-sectional view of an image display device 40 equipped with a touch panel having a transparent electroconductive film 30.

An image display device 40 according to a fourth embodiment of the invention is described with reference to FIG. 5. The image display device 40 includes an image panel 41 for displaying an image created by a mechanical process, an electromagnetic shielding layer 42 having the transparent electroconductive film 10 according to the invention, a touch panel 43 having the transparent electroconductive film 30 according to the invention, and a protective layer 44. As shown in FIG. 5, the electromagnetic shielding layer 42 is laminated, with its patterned transparent conductive layer 14 (refer to FIG. 3) facing down, on the image panel 41 of a liquid crystal display or the like, and the touch panel 43 is placed on the electromagnetic shielding layer 42 with its patterned transparent conductive layer 14 (refer to FIG. 4) facing up. In addition, the protective layer 44 for protecting the touch panel 43 is provided on the touch panel 43. It should be noted that the image display device using the transparent electroconductive films of the invention is not limited to the image display device 40 and may be a display device with a different configuration. For example, the transparent electroconductive films 10 and 20 of the invention may be used. In addition, a plurality of transparent electroconductive films 10 or a plurality of transparent electroconductive films 20 may be used in a stacked state. For example, two transparent electroconductive films 10 may be used in a stacked state with their transparent conductive layers 14 facing up. In this case, the pattern as shown in FIG. 2A may be formed in the upper transparent conductive layer 14. In addition, the pattern as shown in FIG. 2B may be formed in the lower transparent conductive layer 14 such that the pattern does not overlap the pattern of FIG. 2A. At this time, the patterns of FIGS. 2A and 2B are preferably formed such that their electrical connection directions intersect each other (including perpendicular to each other). Two transparent electroconductive films 10 may be stacked to use the patters of the two transparent conductive layers 14 in combination as described above.

Touch panels are divided, according to their position detection method, into several types including optical type, ultrasonic wave type, electromagnetic induction type, capacitance type and resistance film type. The transparent electroconductive films of the invention can be used in any type of touch panel. In particular, the transparent electroconductive films of the invention are suitable for capacitance type touch panels because the pattern shape of the transparent conductive layer is less visible.

[Method for Producing Transparent Electroconductive Film]

Figure 6:
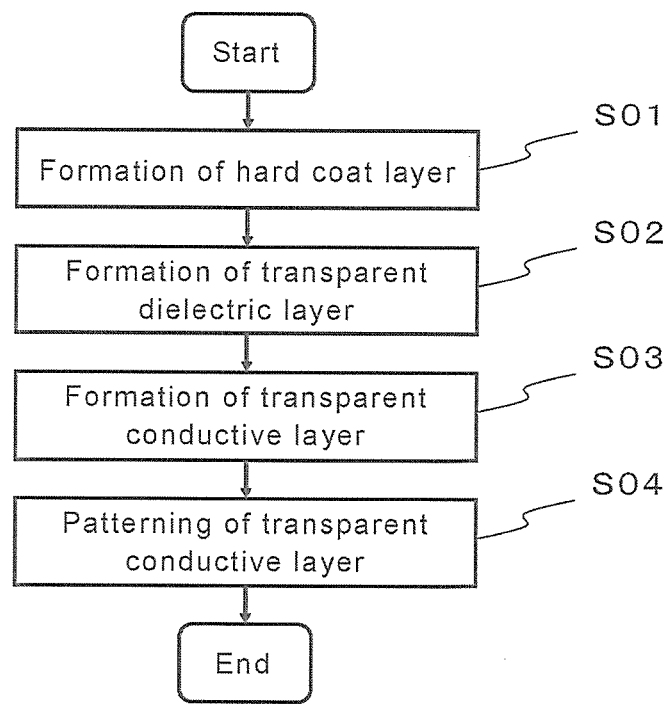
FIG. 6 is a flowchart, showing the procedure for producing a transparent electroconductive film (having a transparent dielectric layer).

A method for producing a transparent electroconductive film according to a fifth embodiment of the invention is described with reference to FIG. 6. First, a hard coat layer 12 is laminated by a wet coating method on one side of a transparent substrate 11 formed of a film-like polymeric resin (S01). Next, a transparent dielectric layer 13 is laminated as needed on the side of the hard coat layer 12 opposite the substrate 11 (S02). Then, a transparent conductive layer 14 is laminated on the side of the transparent dielectric layer 13 opposite the hard coat layer 12 (S03). Finally, the transparent conductive layer 14 is patterned (S04). As the substrate 11, a film having a thickness of 2 to 250 μm is used. This production method further includes a step of adding an inorganic oxide to a curable resin. Thus, the hard coat layer 12 is formed of a curable resin containing an inorganic oxide, and is formed to have a refractive index of 1.40 to 1.90 and a thickness of 0.01 to 10 μm. The transparent dielectric layer 13 is formed of an inorganic substance so as to have a refractive index of 1.30 to 1.50 and a thickness of 10 to 100 nm. The transparent conductive layer 14 is formed of at least one selected from the group consisting of inorganic oxides such as zinc oxide, tin oxide, aluminum oxide, titanium oxide, indium oxide, indium tin oxide (ITO), indium zinc oxide (IZO), gallium-added zinc oxide, fluorine-added tin oxide, antimony-added tin oxide, aluminum-added zinc oxide (AZO) and silicon-added zinc oxide, metals such as silver and copper, and carbon so as to have a thickness of 10 nm to 2 μm. After that, the transparent conductive layer 14 is patterned into a predetermined shape. In this production method, because the hard coat layer is laminated by a wet coating method, the hard coat layer can be laminated inexpensively at a line speed of a few dozen meters per minute (such as approximately 20 m/min) with high production efficiency. In addition, because the hard coat layer is formed of a curable resin containing an inorganic oxide, the refractive index of the hard coat layer can be easily adjusted by selecting the type and amount of the inorganic oxide contained therein. Because the hard coat layer has a function of reducing the difference in optical characteristics between the patterned portions and non-patterned portions of the transparent conductive layer as described above, the transparent electroconductive film of this application can have a simpler layer configuration as compared to conventional IM films.

EXAMPLES

In the following, the invention will be explained in detail by way of Examples, but the invention is in no way limited to the Examples.

[Method for Measuring Properties and Method for Evaluating Effects]

The method for measuring properties and the method for evaluating effects in the invention are as follows.

(Total Light Transmittance)

The total light transmittance was measured with NDH-5000 manufactured by Nippon Denshoku Industries Co., Ltd. in accordance with JIS-K7361.

(Color Difference)

In accordance with JIS-Z8729, the L*, a* and b* values of transmitted light from a patterned portion and a non-patterned portion were measured with SD5000 manufactured by Nippon Denshoku Industries Co., Ltd. and a color difference $\Delta E^*$ was calculated. The color difference $\Delta E^*$ was calculated by squaring the differences $\Delta L^*$, $\Delta a^*$ and $\Delta b^*$ in L*, a* and b* values between a patterned portion and a non-patterned portion, summing up the squared values and taking the square root of the sum ($\Delta E \geq 0$). As the $\Delta E^*$ value is smaller, the patterned portions are less visible.

(Surface Resistance Value)

The surface resistance value (Ω/□) of the ITO film was measured by a four-terminal method using MCP-T610 manufactured by Mitsubishi Chemical Analytech Co., Ltd.

(Thickness of Each Layer)

The thickness of the transparent plastic substrate 11 was measured with a micro-gauge type thickness meter MF-501 manufactured by Nikon Corporation. The thicknesses of the other layers were measured by observing a cross section under a scanning electron microscope SU70 manufactured by Hitachi, Ltd.

(Refractive Index of Each Layer)

The refractive index of each layer was measured with an Abbe refractometer manufactured by Atago Co., Ltd.

(Evaluation of Visibility)

A sample of the transparent electroconductive film was placed on a black plate with its transparent conductive layer facing up, and it was visually evaluated whether the patterned portions and non-patterned portions (pattern opening portions) were distinguishable according to the following criteria.

○: Patterned portions and non-patterned portions (pattern opening portions) are hardly distinguishable.

Δ: Patterned portions and non-patterned portions (pattern opening portions) are slightly distinguishable.

×: Patterned portions and non-patterned portions (pattern opening portions) are clearly distinguishable.

(Particle Size Distribution)

The particle size distribution was measured by a dynamic light scattering method using Nanotrac UPA-UT151 manufactured by Nikkiso Co., Ltd. The volume average particle sizes as measured when the solid content concentration is diluted to 10% with 1-methoxy-2-propanol are shown below.

Peltron XJA-0189: 42 nm
Peltron XJA-0190: 37 nm
Lioduras TYZ74: 95 nm

[Preparation of Hard Coat Layer Coating Liquids]

(Preparation of Hard Coat Layer Coating Liquid (a1))

A hard coat layer coating liquid (a1) was prepared by mixing 100 parts by weight of an acrylic ultraviolet curable resin (UNIDIC 17-824-9 manufactured by DIC Corporation), 63 parts by weight of a colloidal zirconia (NanoUse OZ-S30K manufactured by Nissan Chemical Industries, Ltd.), and 460 parts by weight of methyl isobutyl ketone.

(Preparation of Hard Coat Layer Coating Liquid (a2))

A hard coat layer coating liquid (a2) was prepared by mixing 100 parts by weight of an acrylic ultraviolet curable resin (UNIDIC 17-824-9 manufactured by DIC Corporation), 150 parts by weight of a colloidal zirconia (NanoUse OZ-S30K manufactured by Nissan Chemical Industries, Ltd.), and 420 parts by weight of methyl isobutyl ketone.

(Preparation of Hard Coat Layer Coating Liquid (a3))

A hard coat layer coating liquid (a3) was prepared by mixing 100 parts by weight of an acrylic ultraviolet curable resin (UNIDIC 17-824-9 manufactured by DIC Corporation), and 150 parts by weight of methyl isobutyl ketone. Coating liquid (a3) does not contain a colloidal zirconia.

Reference Example 1

(Formation of Hard Coat Layer (A1))

The hard coat layer coating liquid (a1) was applied with a bar coater to one side of a transparent plastic substrate of a polyethylene terephthalate film (which is hereinafter referred to as "PET film") with a thickness of 125 μm in such an amount that a thickness of 0.8 μm would be obtained after UV curing. The resulting coated film was dried at 80° C. for 30 seconds, and then irradiated with ultraviolet rays at an illuminance of 200 mW/cm² and an exposure of 500 mJ/cm² using a conveyor type UV irradiator (ECS-801G1 manufactured by Eye Ggraphics Co., Ltd.) equipped with a high-pressure mercury lamp (H08-L41 manufactured by Iwasaki Electric Co., Ltd., rating: 120 W/cm) to form a hard coat layer (A1). The exposure was measured with an illuminometer (UVPF-A1/PD-365 manufactured by Iwasaki Electric Co., Ltd.).

(Formation of Hard Coat Layer (B1))

The hard coat layer coating liquid (a1) was applied with a bar coater to the side of the PET film opposite the side on which the hard coat layer (A1) had been formed in such an amount that a thickness of 1.2 μm would be obtained after UV curing. After this, the same procedure as used to form the hard coat layer (A1) was followed.

Reference Example 2

(Formation of Hard Coat Layer (A2))

A hard coat layer (A2) was formed by following the same procedure as used to form the hard coat layer (A1) of Reference Example 1 except that the hard coat layer coating liquid (a1) was changed to the hard coat layer coating liquid (a2). The hard coat layer (A2) had a thickness of 0.9 μm.

(Formation of Hard Coat Layer (B2))

A hard coat layer (B2) was formed by following the same procedure as used to form the hard coat layer (B1) of Reference Example 1 except that the hard coat layer coating liquid (a1) was changed to the hard coat layer coating liquid (a2). The hard coat layer (B2) had a thickness of 1.4 μm.

Reference Example 3

(Formation of Hard Coat Layer (A3))

A hard coat layer (A3) was formed by following the same procedure as used to form the hard coat layer (A1) of Reference Example 1 except that the acrylic ultraviolet curable resin used in the hard coat layer coating liquid (a1) was changed to an acrylate-based ultraviolet curable resin (Peltron XJC-0563-FL manufactured by Pelnox Limited). The hard coat layer (A3) had a thickness of 0.8 μm.

(Formation of Hard Coat Layer (B3))

A hard coat layer (B3) was formed by following the same procedure as used to form the hard coat layer (B1) of Reference Example 1 except that the acrylic ultraviolet curable resin used in the hard coat layer coating liquid (a1) was changed to an acrylate-based ultraviolet curable resin (Peltron XJC-0563-FL manufactured by Pelnox Limited). The hard coat layer (B3) had a thickness of 1.3 μm.

Reference Example 4

(Formation of Hard Coat Layer (A4))

A hard coat layer (A4) was formed by following the same procedure as used to form the hard coat layer (A1) of Reference Example 1 except that the acrylic ultraviolet curable resin used in the hard coat layer coating liquid (a1) was changed to an acrylate-based ultraviolet curable resin (Lioduras TYT80-01 manufactured by Toyo Ink Mfg. Co., Ltd.). The hard coat layer (A4) had a thickness of 0.8 μm.

(Formation of Hard Coat Layer (B4))

A hard coat layer (B4) was formed by following the same procedure as used to form the hard coat layer (B1) of Reference Example 1 except that the acrylic ultraviolet curable resin used in the hard coat layer coating liquid (a1) was changed to an acrylate-based ultraviolet curable resin (Lioduras TYT80-01 manufactured by Toyo Ink Mfg. Co., Ltd.). The hard coat layer (B4) had a thickness of 1.5 μm.

Comparative Example 1

(Formation of Hard Coat Layer (B5))

A hard coat layer (B5) was formed by following the same procedure as in Reference Example 1 except that no hard coat layer (A1) was provided. The hard coat layer (B5) had a thickness of 1.5 μm.

Comparative Example 2

(Formation of Hard Coat Layer (A6))

A hard coat layer (A6) was formed by following the same procedure as used to form the hard coat layer (A1) of Reference Example 1 except that the hard coat layer coating liquid (a1) was changed to the hard coat layer coating liquid (a3). The hard coat layer (A6) had a thickness of 0.8 μm.

(Formation of Hard Coat Layer (B6))

A hard coat layer (B6) was formed by following the same procedure as used to form the hard coat layer (B1) of Reference Example 1 except that the hard coat layer coating liquid (a1) was changed to the hard coat layer coating liquid (a3). The hard coat layer (B6) had a thickness of 1.3 μm.

Common to Reference Examples 1 to 4 and Comparative Examples 1 and 2

(Formation of SiO₂/Transparent Dielectric Layer)

A transparent dielectric layer was formed on the hard coat layers (A1) to (A6) of Reference Examples 1 to 4 and Comparative Examples 1 and 2 by a reactive sputtering method using a Si target material in an atmosphere of a mixed gas of argon and oxygen. An SiO₂ thin film with a thickness of 30 nm and a refractive index of 1.45 was obtained.

(Formation of ITO/Transparent Conductive Layer)

Next, a transparent conductive layer was formed on the transparent dielectric layer by a sputtering method using a target composed of 98% by mass of indium oxide and 2% by mass of tin oxide. An ITO film with a thickness of 30 nm was obtained. Then, a photoresist film having a predetermined pattern was formed on the ITO film, and the resulting laminate was immersed in a hydrochloric acid solution to etch the ITO film in order to form a pattern. After the patterning of the ITO film, the ITO film was subjected to a heating treatment at 150° C. for 90 minutes to crystallize the ITO film portions. As a result, transparent electroconductive films of Reference Examples 1 to 4 and Comparative Examples 1 and 2 were obtained.

The layer configurations of the ITO transparent electroconductive films of Reference Examples 1 to 4 and Comparative Examples 1 and 2 are shown in FIG. 7. The results of experiments on the ITO transparent electroconductive films of Reference Examples 1 to 4 and Comparative Examples 1 and 2 are shown in Table 1.

TABLE 1

| | Ref. Ex. 1 | Ref. Ex. 2 | Ref. Ex. 3 | Ref. Ex. 4 | Comp. Ex. 1 | Comp. Ex. 2 |
|---|---|---|---|---|---|---|
| Refractive index | | | | | | |
| Hard coat layer (A1 to A6) | 1.58 | 1.62 | 1.65 | 1.80 | — | 1.52 |
| Hard coat layer (B1 to B6) | 1.58 | 1.62 | 1.65 | 1.80 | 1.58 | 1.52 |

TABLE 1-continued

|  | Ref. Ex. 1 | Ref. Ex. 2 | Ref. Ex. 3 | Ref. Ex. 4 | Comp. Ex. 1 | Comp. Ex. 2 |
|---|---|---|---|---|---|---|
| Surface resistance value ($\Omega/\square$) | 270 | 280 | 280 | 290 | 270 | 270 |
| Total light transmittance (%) | | | | | | |
| Patterned portions | 88.6 | 88.9 | 88.5 | 88.3 | 88.9 | 88.2 |
| Non-patterned portions | 90.7 | 90.1 | 91.2 | 89.1 | 90.1 | 90.2 |
| Color difference ($\Delta E^*$ value) | 2.89 | 2.61 | 2.42 | 1.39 | 3.86 | 4.27 |
| Visibility | ○ | ○ | ○ | ○ | Δ | x |

Reference Example 5 and Comparative Example 3

Reference Example 5 and Comparative Example 3 were different from Reference Example 4 and Comparative Example 2, respectively, in that no transparent dielectric layer ($SiO_2$) was provided and the transparent conductive layer was formed of silver.

(Formation of Silver/Transparent Conductive Layer)

A coating liquid containing silver nanoparticles (Silver Nanoparticle Ink manufactured by Sigma-Aldrich Japan) was coated with a bar coater on the hard coat layer (A4) of Reference Example 4 and the hard coat layer (A6) of Comparative Example 2. Each of the resulting coated films was dried at 120° C. for 60 seconds to form a transparent conductive layer.

The layer configurations of the silver transparent electroconductive films of Reference Example 5 and Comparative Example 3 are shown in FIG. 7. The results of experiment (refractive index) on the silver transparent electroconductive films of Reference Example 5 and Comparative Example 3 are shown in Table 2.

TABLE 2

|  | Hard coat layer (A) | Hard coat layer (B) | Visibility |
|---|---|---|---|
| Ref. Ex. 5 | 1.80 | 1.80 | ○ |
| Comp. Ex. 3 | 1.52 | 1.52 | x |

Reference Example 6 and Comparative Example 4

Reference Example 6 and Comparative Example 4 were different from Reference Example 4 and Comparative Example 2, respectively, in that no transparent dielectric layer ($SiO_2$) was provided and the transparent conductive layer was formed of carbon.

(Formation of Carbon/Transparent Conductive Layer)

A coating liquid containing carbon nanoparticles (EP TDL-2MIBK manufactured by Mitsubishi Materials Electronic Chemicals Co., Ltd) was coated with a bar coater on the hard coat layer (A4) of Reference Example 4 and the hard coat layer (A6) of Comparative Example 2. Each of the resulting coated films was dried at 120° C. for 60 seconds to form a transparent conductive layer.

The layer configurations of the carbon transparent electroconductive films of Reference Example 6 and Comparative Example 4 are shown in FIG. 7. The results of experiment (refractive index) on the carbon transparent electroconductive films of Reference Example 6 and Comparative Example 4 are shown in Table 3.

TABLE 3

|  | Hard coat layer (A) | Hard coat layer (B) | Visibility |
|---|---|---|---|
| Ref. Ex. 6 | 1.80 | 1.80 | ○ |
| Comp. Ex. 4 | 1.52 | 1.52 | x |

As shown in Table 1, the difference between the patterned portions and non-patterned portions of the transparent electroconductive films of Reference Examples 1 to 4, which satisfy the ranges of the invention, was not emphasized when the transparent conductive layers were patterned. Thus, the transparent electroconductive films are high in visibility when placed and used on the front surface of a touch panel or the like. On the other hand, the transparent electroconductive film which did not have a proper layer configuration (Comparative Example 1) and the transparent electroconductive film having a hard coat layer containing no inorganic oxide (Comparative Example 2) were inferior in visibility because the patterned portions were visible.

As described above, the transparent electroconductive film of the invention has a configuration in which a hard coat layer, a transparent dielectric layer and a transparent conductive layer or a hard coat layer and a transparent conductive layer are laminated in this order, and the thickness and refractive index of each layer are individually controlled. Thus, when the transparent conductive layer is patterned, the difference in optical characteristics between the patterned portions (portions having a transparent conductive layer) and the non-patterned portions (pattern opening portions having no transparent conductive layer) can be very small. Therefore, when the transparent electroconductive film is placed on the front surface of the display of a touch panel, the pattern of the transparent conductive layer is less visible. Thus, the transparent electroconductive film can improve the visibility of the touch panel. In addition, because the hard coat layer contains an inorganic oxide, the refractive index of the hard coat layer can be easily adjusted by selecting the type and amount of the inorganic oxide. Further, because the variations of the refractive index of the hard coat layer can be increased by selecting the type and amount of the inorganic oxide, the options for the refractive index of the transparent dielectric layer and the transparent conductive layer, which are formed on the hard coat layer, can be increased. Moreover, when hard coat layers are laminated on both sides of the transparent plastic substrate, the transparent plastic substrate can be reliably prevented from being curled.

Example 1

(Formation of Hard Coat Layer (A7))

The hard coat layer coating liquid (a2) was applied with a bar coater to one side of a transparent plastic substrate of a polyethylene terephthalate film (which is hereinafter referred to as "PET film") with a thickness of 125 μm in such an amount that a thickness of 0.25 μM would be obtained after UV curing. The resulting coated film was dried at 80° C. for 30 second, and then irradiated with ultraviolet rays at an illuminance of 200 mW/cm² and an exposure of 500 mJ/cm² using a conveyor type UV irradiator (ECS-801G1 manufactured by Eye Ggraphics Co., Ltd.) equipped with a high-pressure mercury lamp (H08-L41 manufactured by Iwasaki Electric Co., Ltd., rating: 120 W/cm) to form a hard coat layer (A7). The exposure was measured with an illuminometer (UVPF-A1/PD-365 manufactured by Iwasaki Electric Co., Ltd.).

(Formation of Hard Coat Layer (B7))

The hard coat layer coating liquid (a3) was applied with a bar coater to the side of the PET film opposite the side on which the hard coat layer (A7) had been formed in such an amount that a thickness of 1.2 μm would be obtained after UV curing. After this, the same procedure as used to form the hard coat layer (A7) was followed.

Example 2

(Formation of Hard Coat Layer (A8))

A hard coat layer (A8) was formed by following the same procedure as used to form the hard coat layer (A7) of Example 1 except that the acrylic ultraviolet curable resin used in the hard coat layer coating liquid (a2) was changed to an acrylate-based ultraviolet curable resin (Peltron XJA-0189 manufactured by Pelnox Limited). The hard coat layer (A8) had a thickness of 0.22 μm.

(Formation of Hard Coat Layer (B8))

A hard coat layer (B8) was formed by following the same procedure as used to form the hard coat layer (B7) of Example 1. The hard coat layer (B8) had a thickness of 1.4 μm.

Example 3

(Formation of Hard Coat Layer (A9))

A hard coat layer (A9) was formed by following the same procedure as used to form the hard coat layer (A7) of Example 1 except that the acrylic ultraviolet curable resin used in the hard coat layer coating liquid (a2) was changed to an acrylate-based ultraviolet curable resin (Lioduras TYZ74-02 manufactured by Toyo Ink Mfg. Co., Ltd.). The hard coat layer (A9) had a thickness of 0.28 μm.

(Formation of Hard Coat Layer (B9))

A hard coat layer (B9) was formed by following the same procedure as used to form the hard coat layer (B7) of Example 1. The hard coat layer (B9) had a thickness of 1.3 μm.

Example 4

(Formation of Hard Coat Layer (A10))

A hard coat layer (A10) was formed by following the same procedure as used to form the hard coat layer (A7) of Example 1 except that the acrylic ultraviolet curable resin used in the hard coat layer coating liquid (a2) was changed to an acrylate-based ultraviolet curable resin (Peltron XJA-0190 manufactured by Pelnox Limited). The hard coat layer (A10) had a thickness of 0.36 μm.

(Formation of Hard Coat Layer (B10))

A hard coat layer (B10) was formed by following the same procedure as used to foam the hard coat layer (B7) of Example 1. The hard coat layer (B10) had a thickness of 1.5 μm Example 5

(Formation of Hard Coat Layer (A11))

A hard coat layer (A11) was formed by following the same procedure as used to form the hard coat layer (A7) of Example 1 except that the acrylic ultraviolet curable resin used in the hard coat layer coating liquid (a2) was changed to an acrylate-based ultraviolet curable resin (Lioduras TYT80-01 manufactured by Toyo Ink Mfg. Co., Ltd.). The hard coat layer (A11) had a thickness of 0.37 μm.

(Formation of Hard Coat Layer (B11))

A hard coat layer (B11) was formed by following the same procedure as used to form the hard coat layer (B7) of Example 1. The hard coat layer (B11) had a thickness of 1.5 μm.

Comparative Example 5

(Formation of Hard Coat Layer (B12))

A hard coat layer (B12) was formed by following the same procedure as in Example 1 except that no hard coat layer (A7) was provided. The hard coat layer (B12) had a thickness of 1.5 μm.

Common to Examples 1 to 5 and Comparative Example 5

(Formation of $SiO_2$/Transparent Dielectric Layer)

A transparent dielectric layer was formed on the hard coat layers (A7) to (A11) and the PET of Examples 1 to 5 and Comparative Example 5 by a reactive sputtering method using a Si target material in an atmosphere of a mixed gas of argon and oxygen. An $SiO_2$ thin film with a thickness of 30 nm and a refractive index of 1.45 was obtained.

(Formation of ITO/Transparent Conductive Layer)

Next, a transparent conductive layer was formed on the transparent dielectric layer by a sputtering method using a target composed of 98% by mass of indium oxide and 2% by mass of tin oxide. An ITO film with a thickness of 30 nm was obtained. Then, a photoresist film having a predetermined pattern was formed on the ITO film, and the resulting laminate was immersed in a hydrochloric acid solution to etch the ITO film in order to form a pattern. After the patterning of the ITO film, the ITO film was subjected to a heating treatment at 150° C. for 90 minutes to crystallize the ITO film portions. As a result, transparent electroconductive films of Examples 1 to 5 and Comparative Examples 5 were obtained.

Example 6 and Comparative Example 6

Example 6 and Comparative Example 6 were different from Example 5 and Comparative Example 5, respectively, in that no transparent dielectric layer ($SiO_2$) was provided and the transparent conductive layer was formed of silver.

(Formation of Silver/Transparent Conductive Layer)

A coating liquid containing silver nanoparticles (Silver Nanoparticle Ink manufactured by Sigma-Aldrich Japan) was coated with a bar coater on the hard coat layer (A11) of Example 5 and the PET film of Comparative Example 5. Each of the resulting coated films was dried at 120° C. for 60 seconds to form a transparent dielectric layer.

Example 7 and Comparative Example 7

Example 7 and Comparative Example 7 were different from Example 5 and Comparative Example 5, respectively, in that no transparent dielectric layer ($SiO_2$) was provided and the transparent conductive layer was formed of carbon.

(Formation of Carbon/Transparent Conductive Layer)

A coating liquid containing carbon nanoparticles (EP TDL-2MIBK manufactured by Mitsubishi Materials Electronic Chemicals Co., Ltd) was coated with a bar coater on the hard coat layer (A11) of Example 5 and the PET film of Comparative Example 5. Each of the resulting coated films was dried at 120° C. for 60 seconds to form a transparent dielectric layer.

The layer configurations of the transparent electroconductive films of Examples 1 to 7 and Comparative Examples 5 to 7 are shown in FIG. 8. The results of experiments on the transparent electroconductive films of Examples 1 to 7 and Comparative Examples 5 to 7 are shown in Tables 4 and 5.

TABLE 4

|  | Ex. 1 | Ex. 2 | Ex. 3 | Ex. 4 | Ex. 5 | Comp. Ex. 5 |
|---|---|---|---|---|---|---|
| Retractive index |  |  |  |  |  |  |
| Hard coat layer (A7 to A11) | 1.58 | 1.69 | 1.75 | 1.77 | 1.81 | — |
| Total light transmittance (%) |  |  |  |  |  |  |
| Transparent conductive layer side (patterned portions) | 89.7 | 89.1 | 88.7 | 88.3 | 89.3 | 90.1 |
| Visibility | ○ | ○ | ○ | ○ | ○ | Δ |

TABLE 5

|  | Ex. 6 | Comp. Ex. 6 | Ex. 7 | Comp. Ex. 7 |
|---|---|---|---|---|
| Refractive index Hard coat layer (A11) | 1.81 | — | 1.77 | — |
| Total light transmittance (%) | 88.4 | 88.1 | 85.2 | 84.1 |
| Transparent conductive layer side (patterned portions) |  |  |  |  |
| Visibility | ○ | Δ | ○ | Δ |

As in the case of the transparent electroconductive films of Reference Example 1 to 6, the difference between the patterned portions and non-patterned portions of the transparent electroconductive films of Examples 1 to 7 was not emphasized even when the transparent conductive layers were patterned. In other words, the patterned portions and non-patterned portions were also hardly distinguishable in the transparent electroconductive films of Examples 1 to 7.

Figure 9:
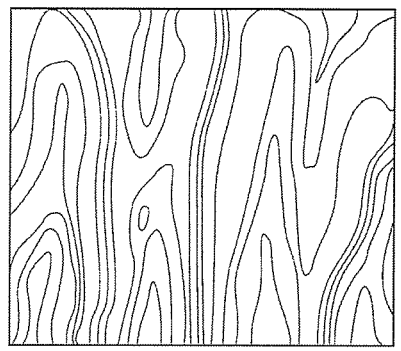
FIG. 9 is a diagram, showing the interference fringes that can be visually observed on photographs of the transparent electroconductive films of Reference Example 1 and Example 3 taken with an adhesive-coated black polyethylene terephthalate film bonded thereto.
Figure 9:
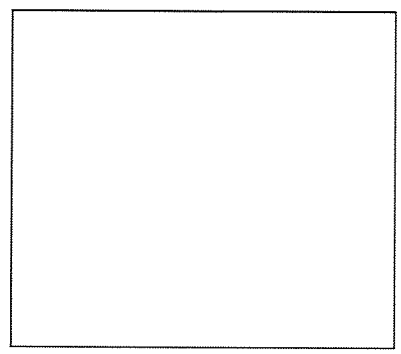

In addition, the transparent electroconductive films of Examples 1 to 7 had a hard coat layer (A7 to A11) which was thinner than the hard coat layer (A1 to A6) of the transparent electroconductive films of Reference Example 1 to 6. Thus, when the transparent electroconductive films of Reference Example 1 and Example 3 were visually compared, less interference fringes were observed, as shown in FIG. 9, on the transparent electroconductive film of Example 3 than on the transparent electroconductive film of Reference Example 1. FIG. 9 is an illustration of interference fringes that can be visually observed on photographs of the transparent electroconductive films of Reference Example 1 and Example 3 taken with an adhesive-coated black polyethylene terephthalate film bonded thereto.

INDUSTRIAL APPLICABILITY

The transparent electroconductive film of the invention is excellent in transparency and visibility when placed on the front surface of a display of a touch panel or the like because the difference in optical characteristics between the patterned portions and non-patterned portions of the transparent conductive layer is small and because the formation of interference fringes can be prevented by adjusting the thickness of the hard coat layer. Thus, the transparent electroconductive film of the invention is especially suitable as a transparent electroconductive film for a touch panel and as an electromagnetic shielding transparent electroconductive film.

Use of the terms "a," "an," "the" and similar referents used in the context in explanation of the invention (particularly in the context of claims as described below) is to be construed to cover both the singular form and the plural form, unless otherwise indicated herein or clearly contradicted by context. The terms "comprising," "having," "including" and "containing" are to be construed as open-ended terms (more specifically, meaning "including, but not limited to") unless otherwise noted. Recitation of ranges of values herein are merely intended to serve as a shorthand method of referring individually to each separate value falling within the range, unless otherwise indicated herein, and each separate value is incorporated herein as if it were individually recited herein. All methods described herein can be performed in any suitable order unless otherwise indicated herein or otherwise clearly contradicted by context. The use of any and all examples, or exemplary language ("such as") provided herein, is intended merely to better illuminate the invention and does not pose a limitation on the scope of the invention unless otherwise claimed. No language herein should be construed as indicating any non-claimed element as essential to the practice of the invention.

Preferred embodiments of the invention are described herein, including the best mode known to the present inventors for carrying out the invention. Variations of the preferred embodiments may become apparent to those skilled in the art upon reading the foregoing description. The present inventors expect skilled artisans to employ such variations as appropriate, and the present inventors intend for the invention to be practiced otherwise than as specifically described herein. Accordingly, the invention includes all modifications and equivalents of the subject matter recited in the claims appended hereto as permitted by applicable law. Moreover, any combination of the elements in all possible variations thereof is encompassed by the invention unless otherwise indicated herein or otherwise clearly contradicted by context.

DESCRIPTION OF REFERENCE NUMERALS AND SYMBOLS 10, 20, 30 Transparent electroconductive film
11, 11' Substrate, Transparent plastic substrate
12, 12' Hard coat layer
13, 13' Transparent dielectric layer
14, 14' Transparent conductive layer
40 Image display device
41 Image panel
42 Electromagnetic shielding layer
43 Touch panel
44 Protective layer

What is claimed is:
1. A transparent electro conductive film, comprising:
a transparent substrate formed of a film-like polymeric resin;
a first hard coat layer laminated on one side of the substrate; and
a first transparent conductive layer laminated on the upper side of the first hard coat layer;

wherein the substrate has a thickness of 2 to 250 μm, wherein the first hard coat layer is formed of an ultraviolet curable resin containing an inorganic oxide and has a thickness of 0.36 μm or greater and less than 0.5 μm, and wherein the first transparent conductive layer is formed of at least one selected from the group consisting of inorganic oxides, metals and carbon, has a thickness of 10 nm to 2 μm, and has been patterned to form and thereby include patterned portions and non-patterned portions.

2. The transparent electroconductive film according to claim 1, wherein the inorganic oxide contained in the first hard coat layer is in the form of fine particles having a volume average particle size of 10 to 100 nm and is contained in the first hard coat layer in an amount of 5 to 95% by weight.

3. The transparent electroconductive film according to claim 1, further comprising a first transparent dielectric layer laminated between the first hard coat layer and the first transparent conductive layer, wherein the first transparent dielectric layer is formed of an inorganic substance and has a thickness of 10 to 100 nm.

4. The transparent electroconductive film according to claim 1, wherein the first hard coat layer has a refractive index of 1.40 to 1.90, and wherein, when the first transparent dielectric layer is provided, the first transparent dielectric layer has a refractive index of 1.30 to 1.50.

5. The transparent electroconductive film according to claim 1, wherein the substrate is formed of at least one selected from the group consisting of polyethylene terephthalate, polyethylene naphthalate, triacetyl cellulose and polycarbonate, and wherein the first transparent conductive layer is formed of at least one selected from the group consisting of indium tin oxide, indium zinc oxide, gallium-added zinc oxide, aluminum-added zinc oxide, silver, copper and carbon.

6. An image display device, comprising:

a touch panel having a transparent electroconductive film according to claim 1; and an image panel provided on the substrate side of the transparent electroconductive film.

7. An image display device, comprising:

a touch panel that allows the user to input information by touching;

an image panel for displaying an image; and an electromagnetic shielding layer having a transparent electroconductive film according to claim 1, the electromagnetic shielding layer being interposed between the touch panel and the image panel.

8. The transparent electroconductive film according to claim 3, wherein the first hard coat layer has a refractive index of 1.40 to 1.90, and wherein, when the first transparent dielectric layer is provided, the first transparent dielectric layer has a refractive index of 1.30 to 1.50.

9. The transparent electroconductive film according to claim 3, wherein the substrate is formed of at least one selected from the group consisting of polyethylene terephthalate, polyethylene naphthalate, triacetyl cellulose and polycarbonate, wherein the first transparent conductive layer is formed of at least one selected from the group consisting of indium tin oxide, indium zinc oxide, gallium-added zinc oxide, aluminum-added zinc oxide, silver, copper and carbon, and wherein the first transparent dielectric layer is formed of silicon dioxide.

* * * * *